(12) United States Patent
He et al.

(10) Patent No.: US 10,631,418 B2
(45) Date of Patent: Apr. 21, 2020

(54) LED DISPLAY SCREEN WITH PROTECTIVE DEVICES

(71) Applicant: Unilumin Group Co., Ltd., Shenzhen, Guangdong (CN)

(72) Inventors: Jinfeng He, Guangdong (CN); Zhenli Yang, Guangdong (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 0 days.

(21) Appl. No.: 16/309,418

(22) PCT Filed: Jan. 12, 2018

(86) PCT No.: PCT/CN2018/072429
§ 371 (c)(1),
(2) Date: Dec. 12, 2018

(87) PCT Pub. No.: WO2018/176991
PCT Pub. Date: Oct. 4, 2018

(65) Prior Publication Data
US 2019/0132965 A1 May 2, 2019

(30) Foreign Application Priority Data
Mar. 31, 2017 (CN) .......................... 2017 1 0207281

(51) Int. Cl.
*H05K 7/02* (2006.01)
*H05K 7/04* (2006.01)
(Continued)

(52) U.S. Cl.
CPC ............. *H05K 5/0017* (2013.01); *G09F 9/33* (2013.01); *H05K 5/0217* (2013.01); *H05K 5/0226* (2013.01)

(58) Field of Classification Search
USPC ........................................ 361/807, 809, 810
See application file for complete search history.

(56) References Cited

U.S. PATENT DOCUMENTS 8,384,616 B2 * 2/2013 Elliott .................. G09F 9/33
345/1.3
9,660,403 B2 * 5/2017 Hochman ................ G09G 5/02
(Continued)

FOREIGN PATENT DOCUMENTS

CN 202373243 U 8/2012
CN 103198766 A 7/2013
(Continued)

OTHER PUBLICATIONS

International search report dated Apr. 12, 2018 from corresponding application No. PCT/CN2018/072429.
(Continued)

*Primary Examiner* — Hung S. Bui
(74) *Attorney, Agent, or Firm* — Hauptman Ham, LLP

(57) ABSTRACT

An LED display screen with protective devices is disclosed. Two adjacent display screen boxes are respectively provided with a first protective device and a second protective device which are retractable; first protective device and second protective device are correspondingly arranged; first protective device is linked with second protective device so that the two adjacent display screen boxes are spliced; and a portion of first protective device and second protective device respectively protrude from the display screen boxes when the two adjacent display screen boxes are not spliced. When the display screen boxes are not spliced, the protruding portions of protective devices may protect the sides of display screen boxes to prevent damage to the display screen boxes caused by collision, etc. Because the protective devices are retractable, they can retract without affecting the splicing between display screen boxes when the display screen boxes are spliced.

9 Claims, 3 Drawing Sheets

(51) Int. Cl.
H05K 5/00 (2006.01)
H05K 5/02 (2006.01)
G09F 9/33 (2006.01)

(56) References Cited

U.S. PATENT DOCUMENTS

| | | | | |
|---|---|---|---|---|
| 2007/0000849 A1* | 1/2007 | Lutz | ............... | G09F 9/33 |
| | | | | 211/26 |
| 2015/0167948 A1* | 6/2015 | Wasserman | ............ | F21S 2/005 |
| | | | | 362/249.01 |
| 2017/0003925 A1* | 1/2017 | Cass | ............ | H05K 5/0017 |
| 2018/0035556 A1* | 2/2018 | Cass | ............ | G06F 3/1446 |

FOREIGN PATENT DOCUMENTS

| | | |
|---|---|---|
| CN | 203120332 U | 8/2013 |
| CN | 103606339 A | 2/2014 |
| CN | 203465908 U | 3/2014 |
| CN | 203512338 U | 4/2014 |
| CN | 203607048 U | 5/2014 |
| CN | 105702175 A | 6/2016 |
| CN | 106683583 A | 5/2017 |
| CN | 206774159 U | 12/2017 |
| KR | 10-2016-0064326 A | 6/2016 |
| WO | 2007061496 A2 | 5/2007 |

OTHER PUBLICATIONS

Australian Examination Report issued in corresponding Application No. 2018241677 dated Sep. 30, 2019.
Extended European Search Report dated Jan. 1, 2020 from corresponding application No. EP 18775273.8.

* cited by examiner

LED DISPLAY SCREEN WITH PROTECTIVE DEVICES

RELATED APPLICATIONS

The present application is a National Phase of International Application Number PCT/CN2018/072429, filed Jan. 12, 2018, and claims the priority of China Application No. 201710207281.1, filed Mar. 31, 2017.

FIELD OF THE INVENTION

The present disclosure relates to the technical field of LED display screen, in particular to an LED display screen with protective devices.

BACKGROUND OF THE INVENTION

Scraping and impact often occur in the process of transportation and installation of LED display screen box, which may cause problems, such as damage and shedding of LED lamp beads, in particular cause the high damage rate to the display screen with lamp beads of a dot pitch below 2 mm, thus seriously affecting the quality of LED display. At present, most manufacturers use fixed protective cover as protection device.

Chinese Patent Application No. 201320627087.6 discloses a packaging box for an LED display screen box. Two inserted-in elastic protective sleeves are placed in the packaging box body, a groove is formed in one end of each inserted-in elastic protective sleeve and a containing cavity is formed in the middle, the packaging box body is sleeved with the two inserted-in elastic protective sleeves from the two ends of the packaging box body to ensure that the packaging box body is contained in the containing cavity, thereby completely enclosing the LED module in the elastic protective sleeves. It can solve the influence of shake and stacking pressure on the quality of display screen box during transportation process. However, it cannot protect the display screen box during mounting or dismounting process, and the packaging box is set separately, which is not easy to manage.

SUMMARY OF THE INVENTION

Technical Problem

The technical problem to be solved by the present disclosure is to provide an LED display with protective devices that can protect display screen boxes during mounting or dismounting process.

Solution to Problem

Technical Solution

In order to solve the above technical problem, the technical solution adopted by the present disclosure is as follows;

an LED display screen with protective devices, which comprises two or more display screen boxes, wherein two adjacent display screen boxes are respectively provided with a first protective device and a second protective device which are retractable; the first protective device is disposed on one side of one display screen box, the second protective device is disposed on one side of the other display screen box of the two adjacent display screen boxes, and the first protective device and the second protective device are correspondingly arranged;

the first protective device is linked with the second protective device so that the two adjacent display screen boxes are spliced;

and a portion of the first protective device and the second protective device respectively protrude from the display screen boxes when the two adjacent display screen boxes are not spliced.

Advantageous Effects of Invention

Advantageous Effects

The present disclosure provides the following beneficial effect. The first protective device and the second protective device are respectively disposed on two opposite sides of two adjacent display screen boxes, and the first protective device and the second protective device are retractable, a portion of the protective devices that protrude from the screen boxes may protect the sides of display screen boxes when the two adjacent display screen boxes are not spliced, to prevent damage to the display screen boxes caused by collision, etc. Moreover, since the first protective device and the second protective device are retractable structure, they can be retracted when splicing is performed between the display screen boxes without affecting the splicing between display screen boxes.

BRIEF DESCRIPTION OF THE DRAWINGS

Description of the Drawings

Figure 1:
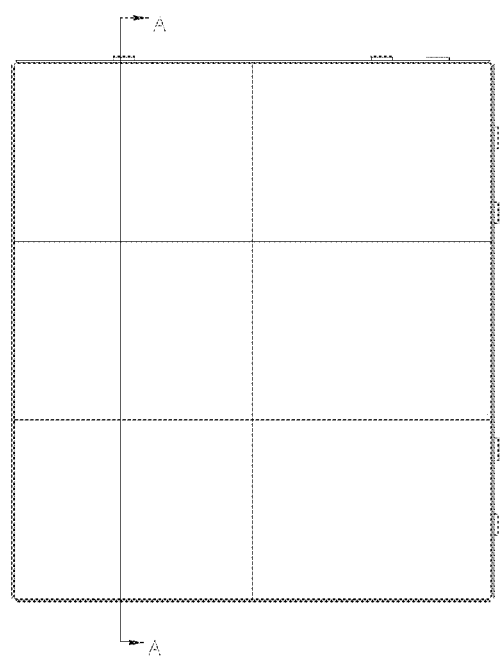

FIG. 1 is an overall structure diagram of a display screen box according to Example 1 of the present disclosure.

Figure 2:
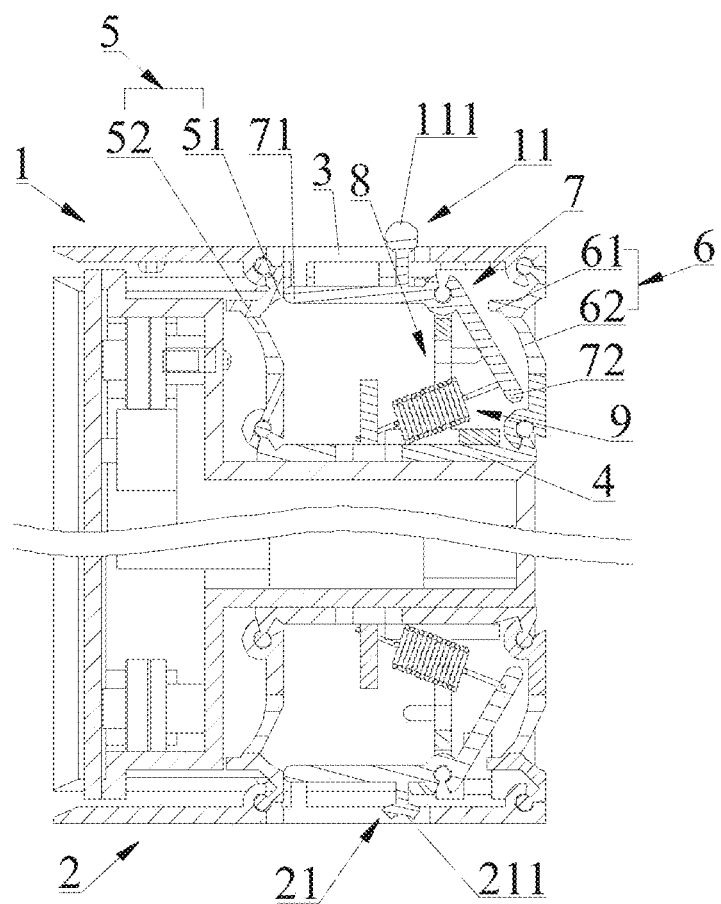

FIG. 2 is a cross-sectional view of a display screen box at A-A according to Example 1 of the present disclosure.

Figure 3:
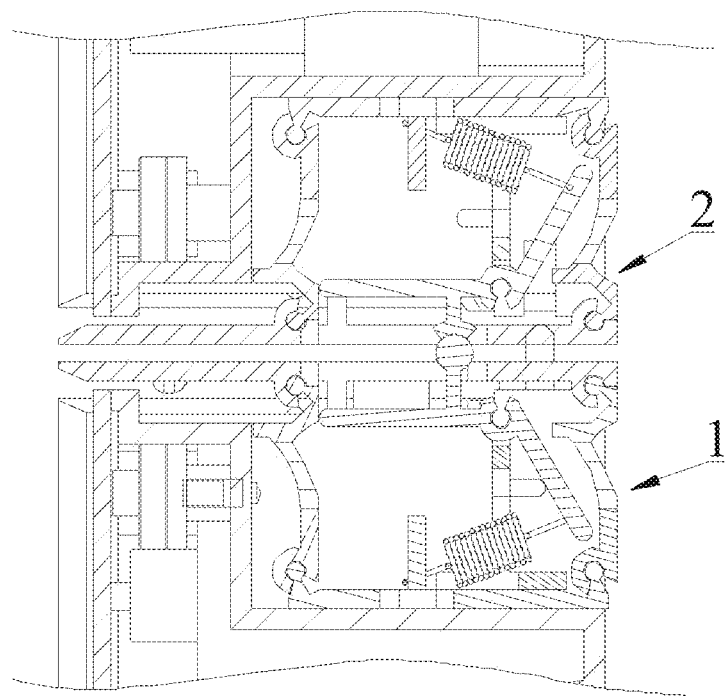

FIG. 3 is a schematic view showing the state of the first protective device and the second protective device before the display screen boxes are spliced according to Example 1 of the present disclosure.

Figure 4:
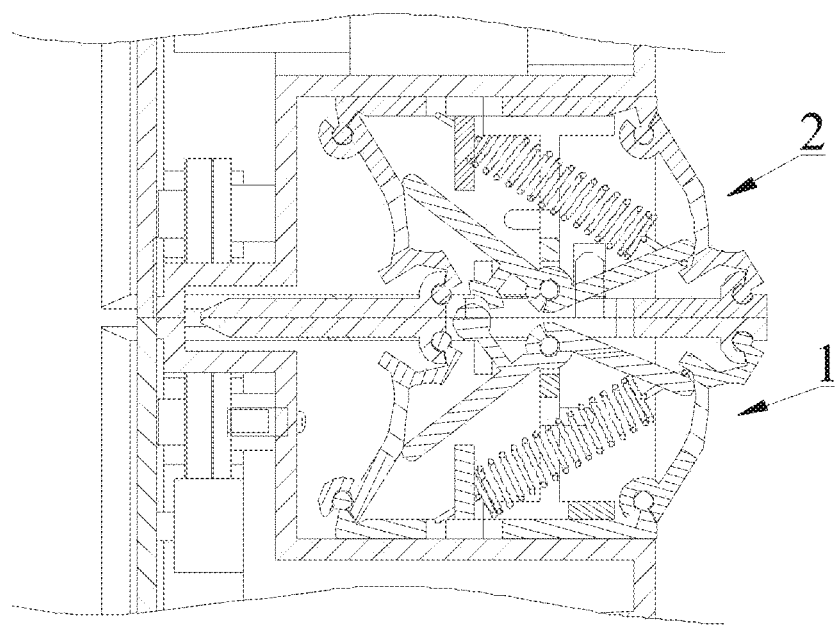

FIG. 4 is a schematic view showing the state of the first protective device and the second protective device after the display screen boxes are spliced according to Example 1 of the present disclosure.

REFERENCE NUMERALS

1—first protective device; 2—second protective device; 3—protective plate; 4—base; 5—first linkage; 6—second linkage; 7—driving member; 8—fixing member; 9—elastic member; 11—first positioning structure; 21—second positioning structure; 51—contact portion; 52—bending portion; 61—abutting portion; 62—acting portion; 71—first free end; 72—second free end; 111—protrusion portion; 211—recess portion.

IMPLEMENTATIONS OF THE INVENTION

Detailed Description of the Invention

The key conception of the present disclosure is that retractable protective devices are disposed on the sides of display screen box and they may protect display screen boxes when the display screen boxes are not spliced.

Referring to FIG. 1 to FIG. 4, an LED display screen with protective devices is provided, which comprises two or more display screen boxes; wherein two adjacent display screen boxes are respectively provided with a first protective device and a second protective device that are retractable; the first protective device is disposed on one side of one display screen box, the second protective device is disposed on one side of the other display screen box of the two adjacent display screen boxes, and the first protective device and the second protective device are correspondingly arranged; the first protective device is linked with the second protective device so that the two adjacent display screen boxes are spliced; and a portion of the first protective device and the second protective device respectively protrude from the display screen boxes when the two adjacent display screen boxes are not spliced.

As can be seen from the above description, the beneficial effect of the present disclosure is as follows. The first protective device and the second protective device are disposed on two opposite sides of the display screen box, thereby preventing the sides of the display screen box from being damaged by collision. Furthermore, the first protective device and the second protective device are configured as retractable structure, they may protect the display screen boxes when in the extended state; and the distance between the LED display screens can be ensured and the splicing between the display screen boxes is not affected when in the retracted state. The position and number of the first protective device and the second protective device can be set as needed, and the shape and size of the portions of the first protective device and the second protective device that protrude from the screen boxes in the extended state can also be set according to the size of the display screen boxes.

Further, the first protective device and the second protective device respectively comprises a parallel four-linkage mechanism which comprises a protective plate, and the protective plate is disposed to protrude from the display screen box when the two adjacent display screen boxes are not spliced.

As can be seen from the above description, the first protective device and the second protective device are retracted and extended through the parallel four-linkage mechanism, and the display screen box is protected through a protective plate when the first protective device and the second protective device are in the extended state.

Further, the parallel four-linkage mechanism also comprises a base, a first linkage, a second linkage; the base is disposed in parallel with the protective plate; two sides of the first linkage are rotationally connected with one end of the protective plate and the base respectively; two sides of the second linkage are rotationally connected with the other end of the protective plate and the base respectively; and the base is fixedly connected with the display screen box.

It can be seen from the above description that the base is fixedly disposed with respect to the display screen box, so that the protective plate may be driven to extend outward or retract inward through the movement of the first linkage and the second linkage.

Further, the first protective device and the second protective device also respectively comprise a driving mechanism, which is located inside the parallel four-linkage mechanism; the driving mechanism comprises a driving member and a fixing member; one end of the fixing member is fixedly connected with the base, the other side of the fixing member is rotationally connected with the middle of the driving member; the driving member comprises a first free end and a second free end, and the first free end abuts against the first linkage when the two adjacent display screen boxes are not spliced.

Further, the second free end abuts against the second linkage when the two adjacent display screen boxes are spliced.

It can be seen from the above description that when the driving member of the driving mechanism rotates relative to the fixing member and the display screen boxes are not spliced, the parallel four-linkage mechanism can be positioned because the first free end abuts against the first linkage; and the parallel four-linkage mechanism can also be positioned to prevent further deformation when the display screen boxes are spliced because that the second free end abuts against the second linkage.

Further, the driving mechanism further comprises an elastic member, one end of the elastic member is fixed to the base, and the other end of the elastic member is fixedly connected to the second free end.

It can be seen from the above description that an elastic member is connected to the second free end, and the driving member may be driven to rotate under the elastic force of the elastic member, and the elastic member may be a return spring.

Further, the first linkage comprises a contact portion and a bending portion that are sequentially connected, and the first free end abuts against the contact portion when the two adjacent display screen boxes are not spliced.

It can be seen from the above description that the first linkage is provided with a contact portion, which can restrict the movement of the first free end, and the movement of the protective plate of the parallel four-linkage mechanism can be driven by the first free end abutting against the contact portion.

Further, the first protective device is provided with a first positioning structure, the second protective device is provided with a second positioning structure, and the first positioning structure and the second positioning structure are matched to perform positioning when splicing is performed between the two adjacent display screen boxes.

It can be seen from the above description that the two adjacent display screen boxes can be positioned by the cooperation of first positioning structure and the second positioning structure when splicing is performed, which can improve the splicing precision and prevent misalignment.

Further, the first positioning structure is disposed on the driving member of the first protective device, and the second positioning structure is disposed on the driving member of the second protective device.

It can be seen from the above description that positioning structures are disposed on the driving members, and the driving members can be driven to rotate by the gravity of the display screen boxes through the positioning structures when splicing is performed, thereby driving the parallel four-linkage mechanism to move to make the protective devices in a retracted state.

Further, the first positioning structure comprises a protrusion portion, the second positioning structure comprises a recess portion, and the protrusion portion is partially received in the recess portion.

It can be seen from the above description that splicing may be performed by the protrusion portion of the first positioning structure and the recess portion of the second positioning structure, and the operation is convenient. Furthermore, the protrusion portion may be designed in a spherical shape, and the recess portion may be designed in a circular arc shape, and the protrusion portion and the recess portion may rotate relative to each other when rotating members rotate.

Example 1

Referring to FIG. 1 to FIG. 4, the Example 1 of the present disclosure is an LED display screen with protective devices, which can provide better protection for the display screen boxes during mounting or dismounting process.

The LED display screen can be spliced from two or more display screen boxes, and the number of display screen boxes to be spliced can be selected according to needs. FIG. 1 is an overall structure diagram of a display screen box. As shown in FIG. 2, which is a cross-sectional view of a display screen box at A-A, first protective device 1 and second protective device 2 are disposed on two opposite sides of the display screen box; first protective device 1 and second protective device 2 partially protrude from the display screen box when the display screen box is not spliced. The position and number of first protective device 1 and second protective device 2 can be set as needed, and they are not limited to be disposed on two sides of the display screen box, and may be disposed on three or four sides of the display screen box.

As shown in FIG. 2, first protective device 1 and second protective device 2 respectively comprises a parallel four-linkage mechanism, which comprises protective plate 3, base 4, first linkage 5 and second linkage 6; first linkage 5 and second linkage 6 can be arranged in parallel; two sides of first linkage 5 are rotationally connected with one end of protective plate 3 and base 4 respectively; two sides of second linkage 6 are rotationally connected with the other end of protective plate 3 and base 4 respectively; and the base is fixedly connected with the display screen box. Preferably, two sides of first linkage 5 are respectively hinged to one end of protective plate 3 and base 4, and two sides of second linkage 6 are respectively hinged to the other end of protective plate 3 and base 4. Of course, other rotating connections can also be used. In the example, first linkage 5 comprises contact portion 51 and bending portion 52 that are sequentially connected, and second linkage 6 comprises abutting portion 61 and acting portion 62 that are sequentially connected.

First protective device 1 and second protective device 2 further respectively comprises a driving mechanism, which is located inside the parallel four-linkage mechanism, and the driving mechanism comprises driving member 7, fixing member 8 and elastic member 9; one end of fixing member 8 is fixedly connected with base 4, the other side of fixing member 8 is rotationally connected with the middle of driving member 7; and driving member 7 comprises first free end 71 and second free end 72. First free end 71 abuts against contact portion 51 of first linkage 5 when the display screen box is not spliced; and second free end 72 abuts against abutting portion 61 of second linkage 6 when the display screen box is spliced. One end of elastic member 9 is fixed to base 4 through a fixing plate, and the other end of elastic member 9 is fixedly connected to second free end 72. Elastic member 9 may be a return spring, and of course it can be other elastic members.

In the example, first protective device 1 is provided with first positioning structure 11, and second protective device 2 is provided with second positioning structure 21; first positioning structure 11 is disposed on the driving member of first protective device 1, and second positioning structure 21 is disposed on the driving member of second protective device 2. Preferably, first positioning structure 11 comprises protrusion portion 111, and second positioning structure 21 comprises recess portion 211. Further preferably, protrusion portion 111 is spherical, recess portion 211 is curved, and protrusion portion 111 may be partially received in recess portion 211.

As shown in FIG. 3, the working principle of first protective device 1 and second protective device 2 in the example is as follows. Two adjacent display screen boxes are respectively provided with first protective device 1 and second protective device 2 which are retractable; first protective device 1 is disposed on one side of a display screen box; second protective device 2 is disposed on one side of the other display screen box of the two adjacent display screen boxes; and first protective device 1 and second protective device 2 are correspondingly arranged. When the vertical splicing is performed between two adjacent display screen boxes, protective plates 3 protrude from display screen box. Firstly, recess portion 211 of the upper display screen box is aligned with protrusion portion 111 of the below display screen box, and first protective device 1 and second protective device 2 are linked/connected. At this time, first free ends 71 of driving members 7 of first protective device 1 and second protective device 2 abut against contact portion 51 of first linkage 5; first free end 71 and second free end 72 start to move under the force of gravity of the upper display screen box, that is, driving members 7 start to rotate, and first free end 71 is separated from contact portion 51. At the same time, second free end 72 acts on action portion 62 of second linkage 6 and drives second linkage 6 to swing, and second linkage 6 will drive protective plate 3 to move toward base 4 since base 4 is fixed. When the parallel four-linkage mechanism moves a certain distance, the driving function of driving member 7 is completed. At this time, the parallel four-linkage mechanism continues to move by the gravity of the upper display screen box until the splicing is completed. As shown in FIG. 4, when the splicing is completed, first free end 71 rotates over bending portion 52, second free end 72 abuts against abutting portion 61, and elastic member 9 is in a stretched state at this time.

When the display screen box is split, driving members 7 of first protective device 1 and second protective device 2 rotate under the elastic force of elastic member 9, and the rotation direction of driving member 7 is opposite to its rotation direction when splicing is performed. When first free end 71 rotates to contact portion 51 of first linkage 5, the first linkage 5 is driven to swing, and protective plate 3 is moved away from base 4 at this time. When the parallel four-linkage mechanism is returned, protective plate 3 protrudes from the display screen box, which can protect the sides of the display screen box.

In summary, the present invention provides an LED display screen with protective devices, the protective devices may protect the sides of the display screen boxes when the display screen box is not spliced, to prevent damage to the display screen box caused by collision, etc. Because the protective devices are retractable structure, they can retract when splicing is performed between the display screen boxes without affecting the splicing between the display screen boxes, and the splicing precision between display screen boxes is high.

What is claimed is:

1. An LED display screen with protective devices, comprising two or more display screen boxes, wherein
each of two adjacent display screen boxes is provided with a first protective device and a second protective device which are retractable; the first protective device is disposed on one side of one display screen box, the second protective device is disposed on one side of the other display screen box of the two adjacent display screen boxes, and the first protective device and the second protective device are correspondingly arranged;

the first protective device is linked with the second protective device so that the two adjacent display screen boxes are spliced;

and a portion of the first protective device and the second protective device respectively protrude from the display screen boxes when the two adjacent display screen boxes are not spliced, and wherein both of the first protective device and the second protective device comprise a parallel four-linkage mechanism which comprises a protective plate, and the protective plate is disposed to protrude from the display screen box when the two adjacent display screen boxes are not spliced.

2. The LED display screen with protective devices according to claim 1, wherein the parallel four-linkage mechanism further comprises a base, a first linkage, a second linkage; the base is disposed in parallel with the protective plate; two sides of the first linkage are rotationally connected with one end of the protective plate and the base respectively; two sides of the second linkage are rotationally connected with the other end of the protective plate and the base respectively; and the base is fixedly connected with the display screen box.

3. The LED display screen with protective devices according to claim 2, wherein the first protective device and the second protective device further respectively comprise a driving mechanism, which is located inside the parallel four-linkage mechanism; the driving mechanism comprises a driving member and a fixing member; one end of the fixing member is fixedly connected with the base, the other side of the fixing member is rotationally connected with the middle of the driving member; the driving member comprises a first free end and a second free end, and the first free end abuts against the first linkage when the two adjacent display screen boxes are not spliced.

4. The LED display screen with protective devices according to claim 3, wherein the second free end abuts against the second linkage when the two adjacent display screen boxes are spliced.

5. The LED display screen with protective devices according to claim 4, wherein the driving mechanism further comprises an elastic member, one end of the elastic member is fixed to the base, and the other end of the elastic member is fixedly connected to the second free end.

6. The LED display screen with protective devices according to claim 4, wherein the first linkage comprises a contact portion and a bending portion that are sequentially connected, and the first free end abuts against the contact portion when the two adjacent display screen boxes are not spliced.

7. The LED display screen with protective devices according to claim 3, wherein the first protective device is provided with a first positioning structure, the second protective device is provided with a second positioning structure, and the first positioning structure and the second positioning structure are matched to perform positioning when splicing is performed between the two adjacent display screen boxes.

8. The LED display screen with protective devices according to claim 7, wherein the first positioning structure is disposed on the driving member of the first protective device, and the second positioning structure is disposed on the driving member of the second protective device.

9. The LED display screen with protective devices according to claim 8, wherein the first positioning structure comprises a protrusion portion, the second positioning structure comprises a recess portion, and the protrusion portion is partially received in the recess portion.

* * * * *